United States Patent [19]

Kobayashi

[11] Patent Number: 4,788,425
[45] Date of Patent: Nov. 29, 1988

[54] OPTICAL AXIS ADJUSTING APPARATUS FOR ELECTRON MICROSCOPE

[75] Inventor: Hiroyuki Kobayashi, Mito, Japan

[73] Assignee: Hitachi, Ltd., Tokyo, Japan

[21] Appl. No.: 105,253

[22] Filed: Oct. 7, 1987

[30] Foreign Application Priority Data

Oct. 8, 1986 [JP] Japan .................................. 61-237967

[51] Int. Cl.$^4$ ............................................ H01J 37/26
[52] U.S. Cl. ...................................... 250/311; 250/397
[58] Field of Search .......................... 250/311, 397, 398

[56] References Cited

U.S. PATENT DOCUMENTS

| | | | |
|---|---|---|---|
| 3,833,811 | 9/1974 | Koike et al. | 250/397 |
| 3,917,946 | 11/1975 | Van Oostrum | 250/397 |
| 3,993,905 | 11/1976 | Mollenstedt | 250/311 |
| 4,097,740 | 6/1978 | Müller et al. | 250/397 |
| 4,451,737 | 5/1984 | Isakozawa | 250/311 |
| 4,531,057 | 7/1985 | Kobayashi | 250/357 |
| 4,623,783 | 11/1986 | Kondo | 250/311 |
| 4,680,469 | 7/1987 | Nomura et al. | 250/311 |
| 4,698,503 | 10/1987 | Nomura et al. | 250/311 |

OTHER PUBLICATIONS

"Observation and Recording of TEM Images Through TV-System" Kobayashi et al., *Proc. XIth Cong. on Electron Microscopy*, Kyoto 1986, pp. 453-454.

Primary Examiner—Bruce C. Anderson
Attorney, Agent, or Firm—Antonelli, Terry & Wands

[57] ABSTRACT

An optical axis adjusting apparatus for an electron microscope for aligning the optical axis of a radiation lens system and the optical axis of an imaging lens system with each other is disclosed. A magnetization current of an objective lens or an accelerating voltage is changed stepwise and an image by the electron microscope is taken in for each change step. The taken-in images are integrated and averaged to produce a blurred image which is in turn stored in an image memory. While displaying this blurred image on a CRT monitor together with a cross marker, the amount of deflection of an electron beam inputted from a deflection input device for moving the cross marker in an interlocking manner is changed so that a cross point of the cross marker is positioned to coincide with a current center or voltage center recognizable from the blurred image displayed. Thereby, the cross marker is moved by an amount equal to the amount of movement of the image due to the change of the deflection amount but in a direction reverse to the direction of the image movement.

12 Claims, 7 Drawing Sheets

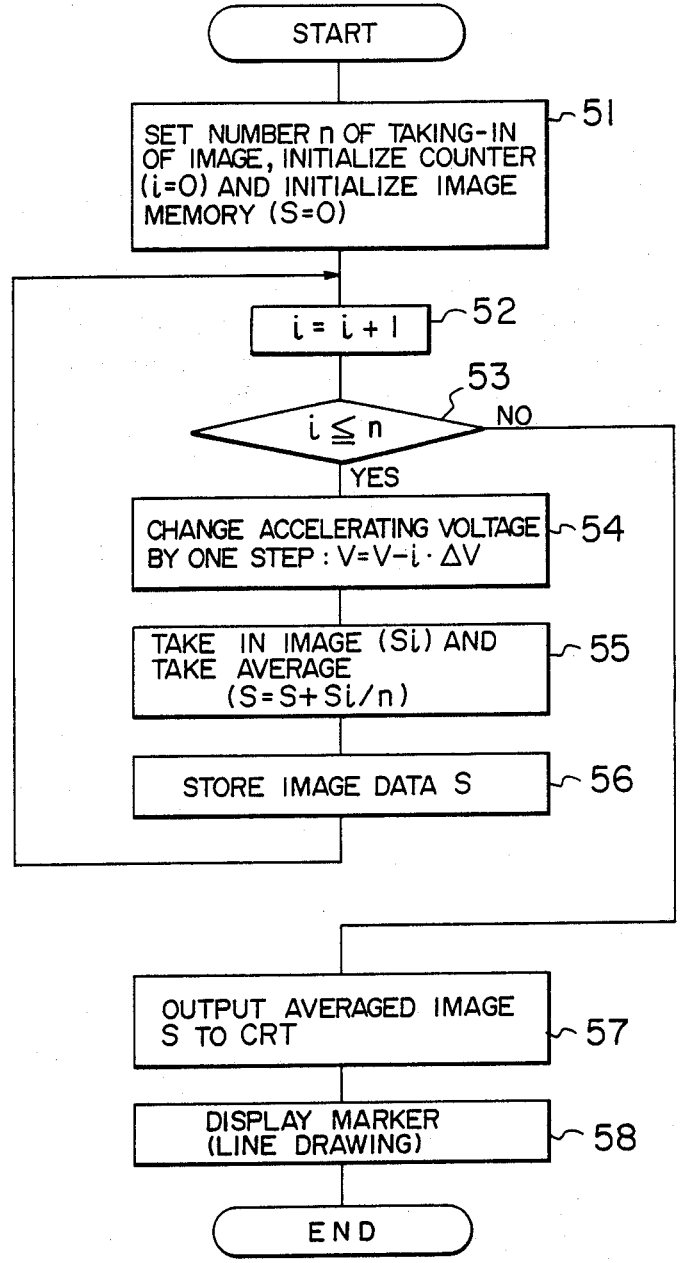

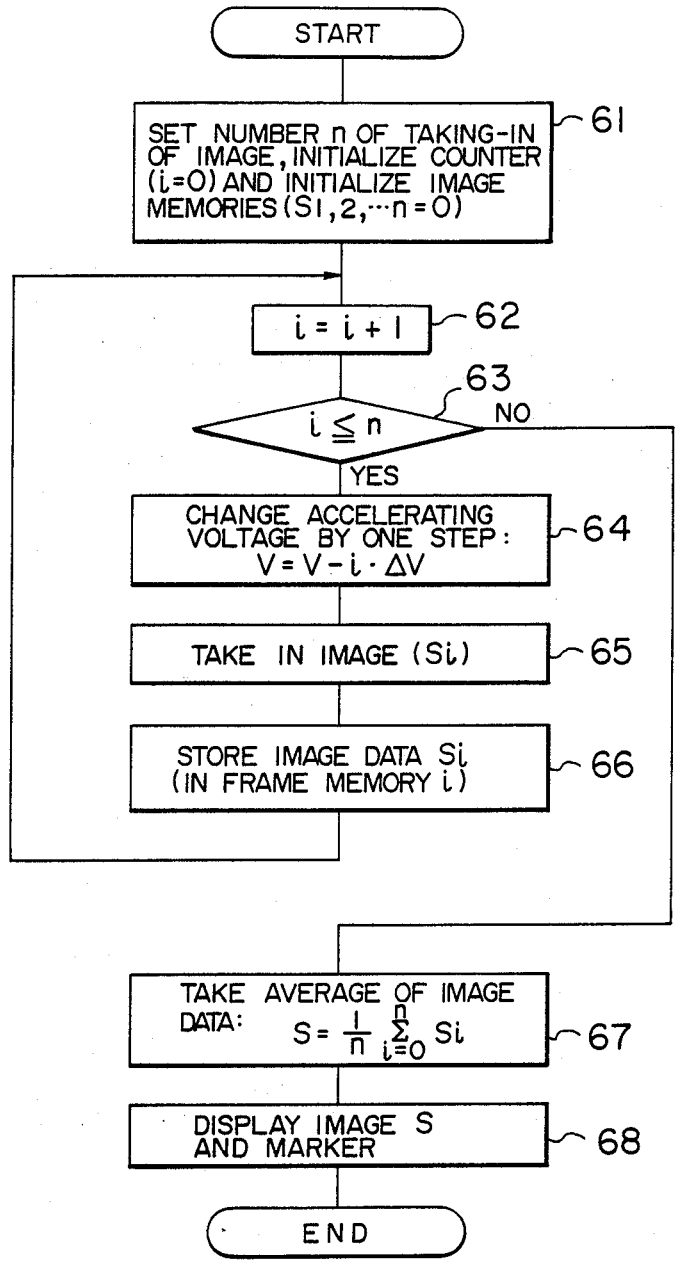

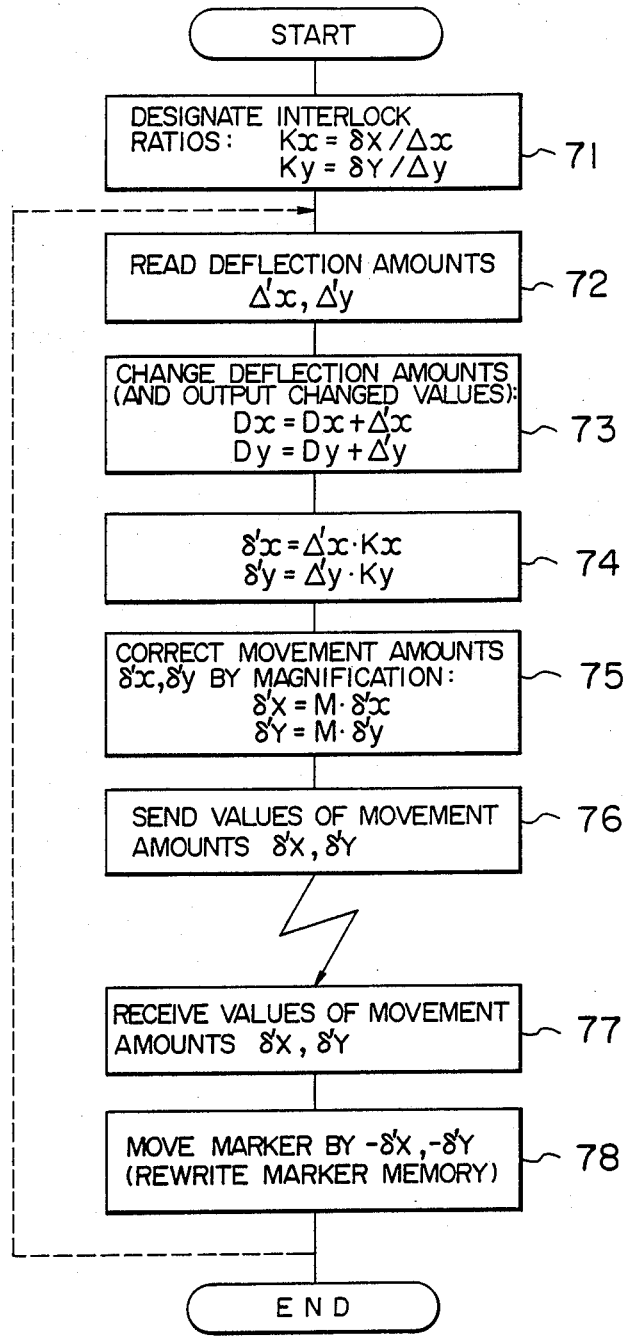

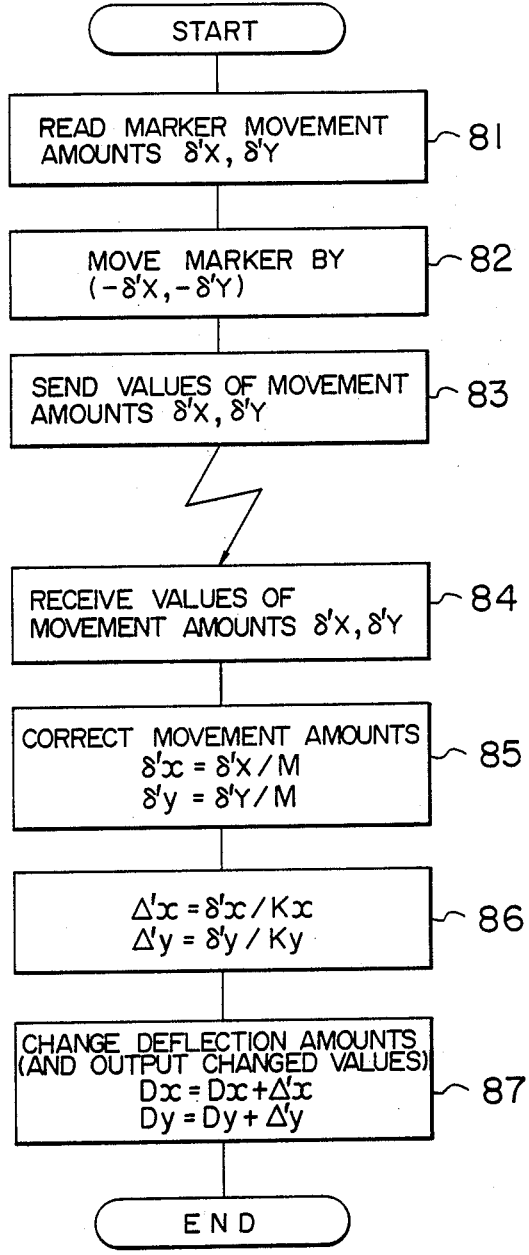

OPTICAL AXIS ADJUSTING APPARATUS FOR ELECTRON MICROSCOPE

BACKGROUND OF THE INVENTION

The present invention relates to an optical axis adjusting apparatus for an electron microscope, and more particularly to such an apparatus for aligning the optical axis of a radiation lens system and the optical axis of an imaging lens system with each other.

Generally, when the optical axis of the radiation lens system is titled with respect to that of the imaging lens system, the adjustment of the optical axes including the optical axis alignment through current change (current alignment) or the optical axis alignment through voltage change (voltage alignment) is carried out. Namely, if an objective lens current or an accelerating voltage is changed, a final image moves circumferentially or radially about a certain point, called a current center or voltage center, which does not move. The optical axis adjustment is performed so as to position the current or voltage center to a center of the final image or usually the center of a flourescent screen to which the final image is projected for observation.

In the above-mentioned adjustment method, however, since the image moves in a circumferential direction or radially about the current or voltage center in accordance with the change of the objective lens current or accelerating voltage, it is hard to recognize the current or voltage center among the movement of the image being observed. Further, the image movement in accordance with the current or voltage change accompanies the blurring of the image. This makes it more difficult to find out the current or voltage center. Thus, the optical axis adjustment requires a great deal of skill.

On the other hand, if the period of the current or voltage change is quickened to utilize an after-image of the flourescent screen being observed, the movement of the image is not be observed but only the blurring of the image is observed. In that case, therefore, it may be possible that the current or voltage center can be easily found out. But, the period of the current or voltage change is limited to several hertz at the highest because of a large time constant of the objective lens coil or the accelerating voltage circuit. Actually, therefore, any movement of the image is involved or observed and hence the current or voltage center cannot be easily found out.

SUMMARY OF THE INVENTION

An object of the present invention is to provide an optical axis adjusting apparatus for an electron microscope capable of easily carrying out the optical axis adjustment by easily finding out the current or voltage center.

This object is achieved by changing an objective lens current or an accelerating voltage, storing a plurality of final images in the course of the current or voltage change into image memories to thereafter integrate or average the stored final images or storing such final images into a image memory while integrating or averaging them, and displaying a blurred image obtained by the integration or averaging to perform the optical axial alignment.

Namely, an image in the case of no change of the object lens current or the accelerating voltage is first stored in the image memory. Next, an image in the case of change $\Delta_1$ is stored in the image memory while being added to the preceding image. A similar operation is repeated for changes $\Delta_2, \Delta_3, \ldots, \Delta_n$. When an image obtained by such an integration is displayed by display means such as a CRT monitor, any image movement at locations other than the current or voltage center is displayed in a blurred form, thereby allowing an operator to obviously find out the current or voltage center.

BRIEF DESCRIPTION OF THE DRAWINGS

FIG. 5 is a flow chart for explaining an embodiment of an image taking-in operation according to the present invention;

FIG. 6 is a flow chart for explaining another embodiment of the image taking-in operation;

FIG. 7 is a flow chart for explaining an embodiment of an optical axis adjusting operation according to the present invention; and FIG. 8 is a flow chart for explaining another embodiment of the optical axis adjusting operation.

DESCRIPTION OF THE PREFERRED EMBODIMENTS

Figure 1:
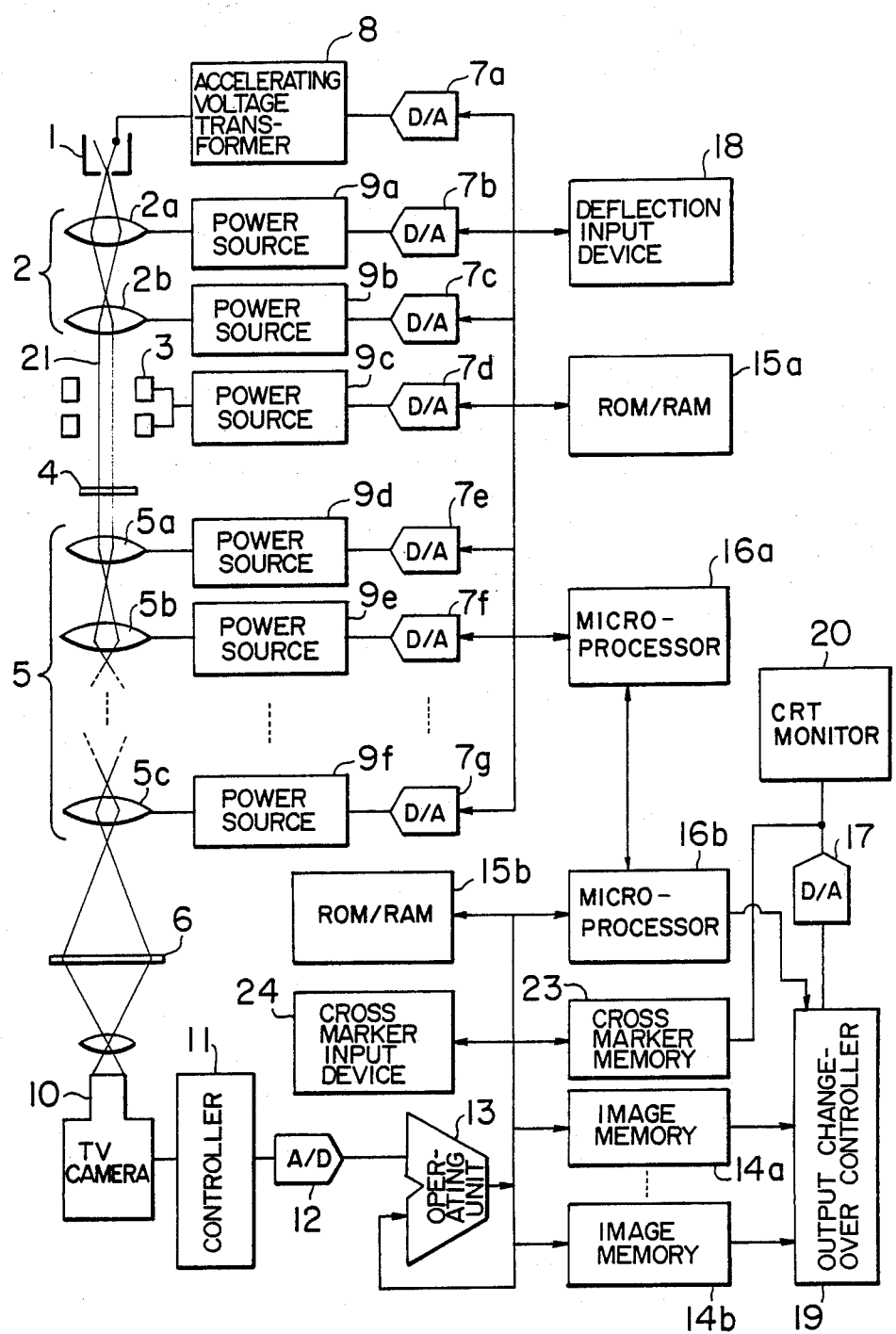
FIG. 1 is a block diagram showing the whole construction of the present invention.

Referring to FIG. 1, an electron beam 21 emitted from an electron gun 1 is condensed by a radiation lens system 2 to irradiate a specimen 4. The electron beam transmitted through the specimen 4 is enlarged by an imaging (or image-forming) lens system 5 to form a final image on a flourescent screen (or phosphor plate) 6. The final image is taken in (or picked up) by a television (TV) camera 10 and converted into an electric signal through a controller 11. The controller 11 has a function of a power source for the TV camera 10 as well as a function of an amplifier for an input video signal.

The input video signal is converted into a digital signal through an A/D converter 12 and stored in an image memory 14a through an operating unit 13. The operating unit 13 operates to sum and average a video signal being now inputted and a preceding video signal of the corresponding picture element previously stored in the image memory 14a and to store the average value in the image memory 14a again. This operation may be also performed by a microprocessor in accordance with a program, as will be described in later. A multiplicity of image memories 14a,--- 14b are prepared for making it possible to store respective input images into a plurality of image memories and to prepare an image memory for storing the result of sum of images stored in the plural image memories. The contents of one of the image memories are selected by an output change-over controller 19 and delivered to a CRT monitor 20 through a D/A converter 17 to display as an image. These controls are made by a microprocessor 16b in accordance with a program which is previously stored in a memory 15b including ROM/RAM. The above-described TV system is known by H. Kobayashi et al "OBSERVATION AND RECORDING OF TEM IMAGES THROUGH TV-SYSTEM", pp. 453–454 of Proc. XI-th Int. Cong. on Electron Microscopy, Kyoto, 1986.

The accelerating voltage, lens currents and electron beam deflector 3 of the electron microscope are controlled by a microprocessor 16a through D/A converters 7a to 7g. This control is made in accordance with a program which is previously stored in a memory 15a including ROM/RAM. Reference numeral 8 designates a transformer for the accelerating voltage, and numerals 9a to 9f designate power sources. Since these circuits are known by U.S. Pat. No. 4,531,057, further explanation will be omitted.

Reference numeral 18 designates a deflection input device for inputting the amount of deflection of an electron beam. The amount of electron beam deflection by the electron beam deflector 3 is set in accordance with an input from the deflection input device 18.

Numeral 23 designates a cross marker memory for storing a cross marker to be displayed on the CRT monitor 20. A cross point of the marker can be moved by an input from a cross marker input device 24.

An information communication is made between the microprocessors 16a and 16b so that the microprocessor 16b causes the TV system to take in an image in synchronism with the change of a magnetization current supplied to an objective lens 5a from the microprocessor 16a or the change of an accelerating voltage supplied to the electron gun 1 from the microprocessor 16a. Further, a change of the amount of deflection by the electron beam deflector 3 is communicated from the microprocessor 16a to the microprocessor 16b to alter the contents of the cross marker memory 23, thereby moving the cross marker on the CRT monitor 20.

Figure 2A:
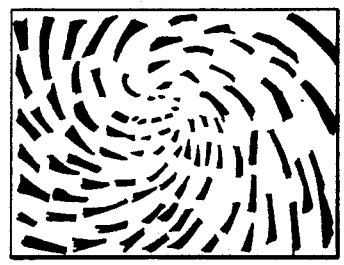
FIGS. 2a and 2b show blurred images displayed by an apparatus according to the present invention.
Figure 2B:
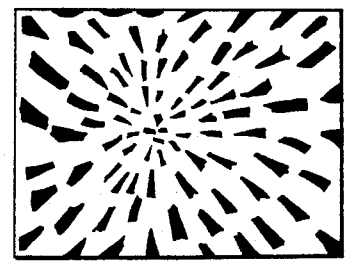

According to an embodiment of the present invention, the objective lens current or the accelerating voltage is changed stepwise under the control of the microprocessor 16a in accordance with a program stored in the ROM 15a. The microprocessor 16b takes an image in the image memory for each step in synchronism with the stepwise change of the current or voltage. For the taking-in of the image for each step, the taken-in image with its intensity divided by the total number of images to be taken in, is stored in one image memory while being added by the operating unit 13 to the image stored in the same image memory at the preceding step. The image thus stored in the image memory is displayed on the CRT monitor 20. Since the image thus displayed is a superimposed form of images when the objective lens current or the accelerating voltage is changed, it appears as a blurred image as shown in FIG. 2a or 2b. As can be readily understood from FIG. 2a or 2b, it is possible to easily find out the current center or voltage center.

Alternatively, the images for the respective steps are taken in the image memories 14a, ---. After the taking-in of the images for all the steps has been completed, all of those images are integrated and averaged by the microprocessor 16b and the resulting average image in a blurred form is stored in the image memory 14b.

Figure 3:
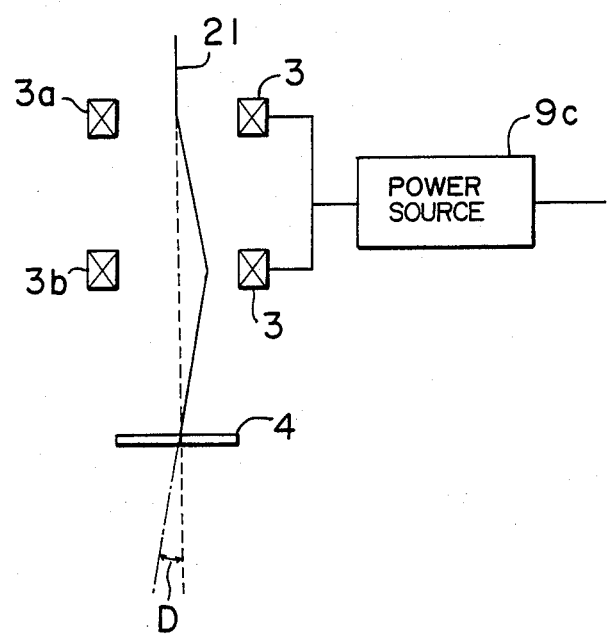
FIG. 3 is a view for explaining an optical axis adjustment according to the present invention.

FIG. 3 is a view for explaining an action of the electron beam deflector 3 for aligning the optical axes of the radiation and imaging lens systems with each other when those axes are tilted with respect to each other. In FIG. 3, a dotted line represents the optical axis of the radiation lens system and a dotted and chain line represents the optical axis of the imaging lens system. When both the optical axes are thus tilted with respect to each other, the electron beam 21 is first deflected by an upper deflection coil 3a to the left seen in a traveling direction of the electron beam and thereafter deflected by a lower deflection coil 3b to the right seen in the beam traveling direction, as shown by a solid line, thereby aligning the optical axis of the radiation lens system with respect to that of the imaging lens system.

Figure 4A:
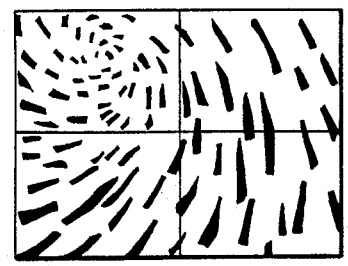
FIGS. 4a to 4f are views for explaining a procedure of the optical axis adjustment according to the present invention.
Figure 4C:
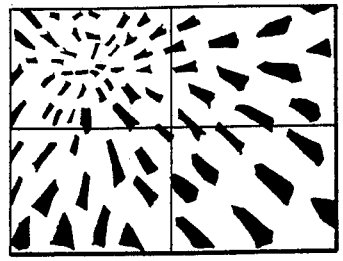
Figure 4B:
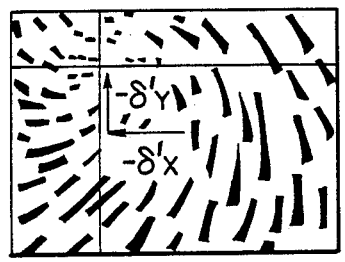
Figure 4D:
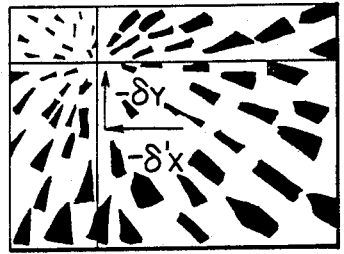
Figure 4E:
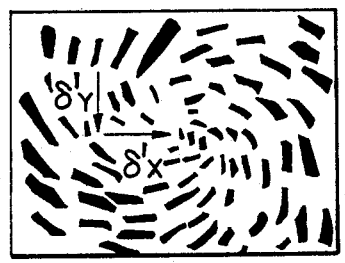
Figure 4F:
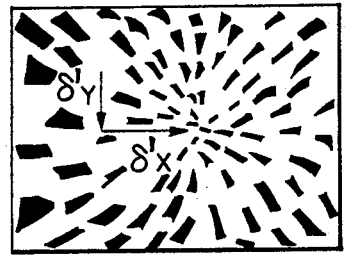

After the blurred image as shown in FIGS. 2a or 2b has been formed by changing the lens current to the accelerating voltage, as is mentioned above, this blurred image and the cross marker are read from the image memory 14a and the cross marker memory 23 respectively and displayed on the CRT monitor 20 in an overlapping manner as shown in FIGS. 4a or 4c. In such a display state, if a deflection signal is inputted from the deflection input device 18, the electron beam deflector 3 changes the amount of deflection of the electron beam on the basis of the deflection signal and at the same time the microprocessor 16b operates to move the cross marker on the CRT monitor 20 in synchronism with the deflection of the electron beam, thereby effecting a center axis alignment so that a cross point of the cross marker coincides with the current center or voltage center, as shown in FIGS. 4b or 4d. If an image on the fluorescent screen 6 is taken in and displayed on the CRT monitor 20, the current center or voltage center of the displayed image is positioned at the center of an image screen of the CRT monitor 20, as shown in FIGS. 4e or 4f. Namely, during a period when an image obtained through the integration and averaging is displayed on the CRT monitor 20, the displayed image is a stationary image however moved by the electron beam deflector 3 the electron beam may be and hence however moved an image on the fluorescent screen 6 may be. On the other hand, the displayed cross marker is moved in an interlocking relation with the deflection of the electron beam by the deflector 3 in a direction reverse to the direction of movement of the image on the flourescent screen 6 but by the same distance as the image movement amount. Accordingly, if the cross point of the cross marker is moved on the CRT monitor 20 from the center of the CRT to the current center or voltage center, the current center or voltage center of the image on the flourescent screen 6 is to be positioned at the center of the fluorescent screen 6. A correspondence relation between the direction and amount of deflection of the electron beam and the direction and amount of movement of the cross marker can be previously determined by experiments or calculation.

The principle of the above-mentioned center axis alignment will be further explained in detail by virtue of mathematical equations.

When the amount $\Delta_x$ (or $\Delta_y$) of deflection for an electron beam in a x- (or y-) direction is inputted from the deflection input device 18, the microprocessor 16a reads this deflection amount to add it to the current or present deflection amount $D_x$ (or $D_g$). The value of $D_{x,y} + \Delta_{x,y}$ is supplied to the electron beam deflector 3 through the D/A converter 7d. The deflection amount D represents a deflection angle, as is shown in FIG. 3. A final image on the fluorescent screen 6 at that time is displayed on the CRT monitor 20 to find out the current or voltage center. Then, the amount $\delta_X$ (or $\delta_Y$) of movement of the current or voltage center of the displayed image from the current of voltage center in the case of the preceding deflection amount $D_{x,y}$ is determined. (For simplification of explanation, it is assumed hereinafter that the x- and y-directions of deflection by the deflector 3 are the same as the X- and Y-directions in the displayed image.) Such a relation between $\delta_{X,Y}$ and $\Delta_{x,y}$ is preliminarily determined by experiments and stored as a linear function in the memory 15b. Since a linear proportion relation exists between any deflection amount $\Delta'_{x,y}$ and the amount $\delta'_{X,Y}$ of movement of the current or voltage center, the following expression is satisfied:

$$\delta'_{X,Y} = \Delta'_{x,y} \delta_{X,Y} / \Delta_{x,y}$$

In this way, there is known the amount of movement of the current or voltage center when the deflection amount is changed from a certain value $D'_{x,y}$ to another value $D'_{x,y} + \Delta'_{x,y}$. Therefore, if a cross marker as shown in FIGS. 4a or 4b is displayed on the CRT monitor 20 in the case of the deflection amount of $D'_{x,y}$ and the cross marker is thereafter moved by $-\delta'_{X,Y}$ as shown in FIGS. 4b or 4d in order to carry out a current or voltage axis alignment, then, the amount of deflection of the electron beam is $D'_{x,y} + \Delta'_{x,y}$. Namely, if an image in the case where the deflection amount is $D'_{x,y} + \Delta'_{x,y}$ or when the deflection amount is corrected by $\Delta'_{x,y}$ is displayed on the CRT, the current or voltage center of that image is to be positioned at a center of the image screen of the CRT, as is shown in FIGS. 4e or 4f. Thus, the current or voltage alignment is completed.

As is apparent from the foregoing explanation, the current or voltage alignment can be very easily attained by merely adjusting the deflection amount inputted from deflection input device so as to move the cross marker to the current or voltage center as shown in FIGS. 4b or 4d.

The above-mentioned image taking-in operation and optical axis adjustment operation will now be explained in accordance with flow charts.

FIG. 5 is a flow chart showing an embodiment of the image taking-in operation. In step 51, the number n of taking-in of image, i.e. the number n of steps in a stepwise change of the lens current or accelerating voltage is set into the RAM 15b, and initialization including the clearing of a counter i for counting the number of images taken in and the clearing of the image memories 14a, --- 14b is made. In step 52, one (1) count is added to the counter i. In step 53, whether the count value of the counter i is smaller than n or not is judged. Since now is the first time, the judgement of YES is made to proceed to step 54 in which the accelerating voltage V is reduced by a minute voltage $\Delta V$ volts. Thereafter, a taken-in video signal is divided by the number n of taking-in of image and the result is added to a signal of the corresponding picture element in the image memory 14a (step 55). In step 56, this value of sum is stored in the image memory 14a again. Since now is the first time, one n-th of the video signal is only written in the image memory 14a the contents of which are zero. The process is returned to step 52 in which the counter i is advanced by one count again. In this manner, the above-mentioned operation is repeated. When step 53 judges that the count value is equal to n, the process goes to step 57 in which the image S in the image memory 14a is displayed on the CRT monitor 20. The image S is one obtained by the integration of n images each having its intensity of 1/n, that is, one represented by an average value. Further, it is a superimposed form of images slightly displayed. Therefore, it is displayed as a blurred image. In step 58, a cross marker is displayed overlapping the blurred image. In the case of changing the objective lens current instead of the accelerating voltage, $I = I - i \cdot \Delta I$ is calculated in step 54.

FIG. 6 is a flow chart showing another embodiment of the image taking-in operation. In the present embodiment, the taken-in images are respectively stored in the image memories 14a, --- as they are, and after all the images has been taken in, these images are summed up (or integrated) and averaged so that the resulting average image is displayed on the CRT monitor 20. Therefore, initialization in step 61 includes clearing all the image memories $S_{1,2,...n}$, and an image taking-in step 65 includes taking an image in the image memory $S_i$ corresponding to the count value of the counter i. In step 67, the images stored in the individual image memories are summed up and averaged. Steps other than the just-mentioned steps are the same as the corresponding steps in FIG. 5. Though FIG. 6 shows the case of changing the accelerating voltage, $I = I - i \cdot \Delta I$ is calculated in step 64 when the objective lens current is changed.

Next, the optical axis adjustment operation will be explained along a flow chart shown in FIG. 7.

Referring to FIG. 7, interlock ratios are designated in step 71. Namely, provided that $\delta_X$ and $\delta_Y$ are the amounts of movement of an image on the fluorescent screen 6 when the changes of $\Delta_x$ and $\Delta_y$ in deflection amount in x- and y-directions are given to the electron beam deflector 3, the microprocessor 16a sets to the RAM 15b the interlock ratios represented by $\delta_X/\Delta_x$ and $\delta_Y/\Delta_y$. In step 72, thereafter, while a cross marker is observed, deflection amounts $\Delta_x'$ and $\Delta_y'$ in a direction in which a cross point of the cross marker coincides with the current or voltage center are inputted from the deflection input device 18. In step 73, the sums $D_x + \Delta_x'$ and $D_y + \Delta_y'$ of the current or present deflection amounts $D_x$ and $D_y$ and the input deflection amounts $\Delta_x'$ and $\Delta_y'$ are supplied to the electron beam deflector 3. The deflection amount represents a deflection angle indicated by D in FIG. 3. In step 74, the deflection amounts $\Delta_x'$ and $\Delta_y'$ are multiplied by the interlock ratios $K_x$ and $K_y$ respectively to determine the movement amounts $\delta_x'$ and $\delta_y'$ on the fluorescent screen 6. In step 75, $\delta_x'$ and $\delta_y'$ are multiplied by a magnification M to determine the movement amounts $\delta_X'$ and $\delta_Y'$ of an image on the fluorescent screen 6 and hence on the CRT monitor 20. In step 76, the movement amounts $\delta_X'$ and $\delta_Y'$ are sent.

On the other hand, the microprocessor 16b receives the movement amounts $\delta_X'$ and $\delta_Y'$ (step 77) and moves the cross marker in a direction reverse to the direction of movement of the image by distances equal to $\delta_X'$ and $\delta_Y'$ (step 78). In this way, an image as shown in FIGS. 4b or 4d can be obtained. Actually, the process may be returned from step 78 to step 72 since the operation in step 72 is carried out while observing the image displayed in step 78. If an image on the fluorescent screen 6 is displayed on the CRT monitor 20 after the above-mentioned procedure has been completed, the image can be displayed with a current or voltage center thereof positioned at the center of the CRT monitor screen.

Though in the embodiment shown in FIG. 7 the cross marker has been moved interlocking with the deflection amount inputted from the deflection input device 18, a method can be employed in which the deflection amount by the deflector 3 is controlled interlocking with the amount of movement of the cross marker by an input from the cross marker input device 24. An example of such a control is shown in FIG. 8.

Referring to FIG. 8, the microprocessor 16b operates in step 81 so that the amounts $\delta_{x'}$ and $\delta_{y'}$ of movement of the cross marker from the cross marker input device 24 by which the cross marker on the CRT monitor 20 is to be moved to the current or voltage center are written in the cross marker memory 23. In step 82, the cross marker is moved by $-\delta_{x'}$ and $-\delta_{y'}$ in accordance with the written marker movement amounts. Next, the marker movement amounts are sent to the microprocessor 16a (step 83).

The microprocessor 16a receives the marker movement amounts $\delta_{x'}$ and $\delta_{y'}$ (step 84), dividing them by the magnification M to determine the amounts $\delta_{x'}$ and $\delta_{y'}$ of movement on the fluorescent screen 6 when it is assumed that the magnification is 1 (step 85), and thereafter dividing the movement amounts $\delta_{x'}$ and $\delta_{y'}$ by the interlock ratios $K_x$ and $K_y$ to determine the deflection amounts $\Delta_{x'}$ and $\Delta_{y'}$ (step 86). In step 87, the process is terminated by altering the deflection amounts by the electron beam deflector 3 from $D_x$ and $D_y$ to $D_x+\Delta_{x'}$ and $D_y+\Delta_{y'}$. If after the termination of this optical axis adjustment operation an image on the fluorescent screen 6 is displayed on the CRT monitor 20, the image can be displayed with a current or voltage center thereof positioned at the center of the CRT monitor screen.

In the above explanation, it has been considered that the directions of coordinates x and y of the deflector 3 are the same as those of coordinates X and Y on the fluorescent screen 6. However, there may be a case where those directions are different from each other because of the rotation of an image due to the magnetization of the imaging lens system. In such a case, the movement is made by use of the amounts $\delta_X$ and $\delta_Y$ of movement in X and Y directions obtained by the following conversion equations:

$$\delta_X = \Delta_x \cos\theta + \Delta_y \sin\theta$$

$$\delta_Y = \Delta_x \sin\theta - \Delta_y \cos\theta$$

Here, $\theta$ is a difference in angle between the x- and y-directions and the X and Y directions.

In the foregoing embodiments, the movement of the cross marker has been made interlocking with the deflection amount. Alternatively, a known image stroke technique can be used to process images taken in the image memory so that only the image is moved on the CRT monitor 20 while maintaining the cross marker at the center of the CRT monitor screen. In that case, it may be not necessary to display the cross marker.

According to the present invention, the current or voltage center can be easily found out and hence the optical axis adjustment can be easily carried out. As a result, the operability of the electron microscope can be greatly improved, which is a great merit for an electron microscope having a TV camera mounted thereto.

The foregoing explanation has been made in conjunction with the transmission type electron microscope. But, it is apparent that the present invention may be equally applied to a scanning type of electron microscope since the same procedure as the herein disclosed procedure can be employed after images scanned are taken into the image memories.

I claim:

1. An optical axis adjusting apparatus for an electron microscope for aligning an optical axis of a radiation lens system and an optical axis of an imaging lens system with each other, said apparatus comprising:
   an electron gun applied with an accelerating voltage for emitting an electron beam;
   said radiation lens system for irradiating a specimen with the electron beam from said electron gun;
   an electron beam deflector for providing a predetermined deflection to the electron beam;
   said imaging lens system for forming an enlarged image of said specimen, said imaging lens system including an objective lens;
   display means for displaying the enlarged image;
   means for changing one of a magnetization current of said objective lens and said accelerating voltage;
   image taking-in means for taking in a plurality of images in the course of the change by said changing means and storing an image in a superimposed form of said plurality of images;
   image output means for causing the image stored in said image taking-in means to be displayed on said display means; and
   optical axis adjustment means for aligning the optical axis of said radiation lens system and the optical axis of said imaging lens system with each other on the basis of the image displayed on said display means.

2. An optical axis adjusting apparatus according to claim 1, said optical axis adjustment means includes marker displaying means for displaying on said display means a marker capable of indicating any point on an image screen of said display means, and interlocking means for causing a movement of said marker and a change of the amount of deflection of the electron beam by said electron beam deflector to interlock with each other.

3. An optical axis adjusting apparatus according to claim 2, wherein said interlocking means includes means for changing the deflection amount to be provided to said electron beam deflector, and marker interlock means for moving said marker by a movement amount equal to the amount of movement of an image due to the change of the deflection amount but in a direction reverse to the direction of movement of the image.

4. An optical axis adjusting apparatus according to claim 3, wherein said marker interlock means includes a marker memory for storing a marker to be displayed, and means for altering the contents of said marker memory so as to move said marker by the amount of movement of said marker.

5. An optical axis adjusting apparatus according to claim 2, said interlocking means includes means for moving said marker, and means for changing the deflection amount by said electron beam deflector so that an image is moved by an amount equal to the amount of movement of said marker but in a direction reverse to the direction of movement of said marker.

6. An optical axis adjusting apparatus according to claim 2, wherein said marker displaying means includes means for displaying a cross marker.

7. An optical axis adjusting apparatus according to claim 1, wherein said optical axis adjustment means includes means for moving one of a current center and voltage center of said image to the center of an image screen of said display means.

8. An optical axis adjusting apparatus according to claim 1, wherein said optical axis adjustment means includes means for displaying a marker indicative of the center of an image screen of said display means, and means for moving one of a current center and voltage center of said image to a position indicated by said marker.

9. An optical axis adjusting apparatus according to claim 1, wherein said image taking-in means includes means for successively integrating the taken-in images with their intensities divided by the number of images to be taken in, and an image memory for storing an image obtained by the integration.

10. An optical axis adjusting apparatus according to claim 1, wherein said image taking-in means includes a plurality of image memories for storing the taken-in images respectively, and a single image memory for storing an image which is to be displayed and is obtained by integrating and averaging the images taken in said plurality of image memories.

11. An optical axis adjusting apparatus according to claim 1, wherein said changing means includes means for changing one of said magnetization current and said accelerating voltage stepwise.

12. An optical axis adjusting apparatus according to claim 11, wherein said image taking-in means includes means for taking in said images for the respective change steps.

* * * * *